United States Patent [19]
Young et al.

[11] Patent Number: 4,698,662
[45] Date of Patent: Oct. 6, 1987

[54] MULTICHIP THIN FILM MODULE

[75] Inventors: Peter L. Young, South Barrington; Chiu-Chao Chen, Hoffman Estates, both of Ill.

[73] Assignee: Gould Inc., Rolling Meadows, Ill.

[21] Appl. No.: 698,472

[22] Filed: Feb. 5, 1985

[51] Int. Cl.$^4$ ...................... H01L 39/02; H01L 23/02
[52] U.S. Cl. .................................. 357/80; 174/16 HS; 357/81
[58] Field of Search ........................... 357/81, 80, 74; 361/381, 392; 174/16 HS; 372/36

[56] References Cited

U.S. PATENT DOCUMENTS

| | | | |
|---|---|---|---|
| 4,027,206 | 5/1977 | Lee | 165/80.3 |
| 4,092,614 | 5/1978 | Sakuma et al. | 372/36 |
| 4,361,717 | 11/1982 | Gilmore et al. | 357/81 |
| 4,450,471 | 5/1984 | Wellhöefer et al. | 357/81 |
| 4,546,478 | 10/1985 | Shimizu et al. | 372/36 |
| 4,604,753 | 6/1986 | Sawai | 372/36 |

FOREIGN PATENT DOCUMENTS 0161662 12/1981 Japan .

OTHER PUBLICATIONS

Spielberger et al., "Silicon-on-Silicon Packaging", *IEEE Transactions on Components, Hybrids, and Manufacturing Technology*, vol. CHMT-7, No. 2 (1984) pp. 193-196.

Satoh et al., "A High Speed Multi-Chip Ram Module with Thermal Stress Free Configuration", Proceedings of the International Conference on Computer Design, Oct. 1984, pp. 569-572.

"GigaBit Develops Silicon Packaging", Electronic News, 11-12-84.

*Primary Examiner*—James W. Davie
*Assistant Examiner*—Georgia Y. Epps
*Attorney, Agent, or Firm*—G. Paul Edgell; Robert J. Fox; Edward E. Sachs

[57] ABSTRACT

A package for thermal dissipation of heat from multiple integrated circuit chips is described. The package includes a silicon substrate for electrical connection to silicon integrated-circuit chips. The silicon substrate provides a high degree of thermal dissipation of heat generated by the chips. In addition, the invention comprehends that the silicon substrate is attached to a heat dissipating means. In the preferred embodiment, the heat dissipating means includes a metal heat sink. The package is capable of dissipating up to six watts per square centimeter of heat from the chips.

12 Claims, 4 Drawing Figures

MULTICHIP THIN FILM MODULE

BACKGROUND OF THE INVENTION

The invention relates generally to thermal-dissipation techniques for integrated-circuit technology and more specifically relates to multichip thin-film interconnect modules having high thermal dissipation requirements.

The present technology for packaging integrated circuits typically involves placement of a plurality of integrated circuits on a relatively large multiplayer board. The boards are typically formed of glass epoxy or thick polyimide substrates. In conventional dip-packaging technology, the integrated circuit chips are typically widely spaced on the board such that the power density required to be dissipated is on the order of less than 0.2 watts per centimeter square. As the speed of the semiconductor circuits increases, the integrated circuit chips must be placed closer together in order to preserve the high performance characteristics of the integrated circuit chips. Furthermore, the power dissipation per chip also drastically increases as the speed of the integrated circuit chips increases. As a result, the anticipated power density can be as high as six watts per centimeter square in future generations of high speed computers.

Thus, one of the objectives of packaging techniques for future generation integrated-circuit devices is to be able to dissipate significantly more heat than is currently being dissipated using traditional packaging technology. Another problem associated with increased heat dissipation and generation is that any thermal mismatch between the integrated-circuit chip package and its underlying multilayer circuit board will be undesirably intensified.

As is well known in the art, conventional integrated-circuit chips are encased in a plastic material which has relatively low thermal conductivity. One approach other have taken in the past to enhance the thermal conductivity of the integrated circuit package is to encase the chip in other materials such as beryllia (BeO) which is a ceramic having relativety high thermal conductivity. However, one disadvantage of this technique is that BeO is very toxic and, thus, is undesirable to use.

Attempts to alleviate the problem of thermal mismatch between an integrated circuit package and an underlying circuit board have included eliminating the traditional plastic package around the integrated circuit and placing the integrated circuit chip directly on a silicon substrate. The silicon substrate has essentially the same thermal expansion characteristics as the integrated-circuit chip. However, even with this advancement over the prior art, it is still desirable to increase the thermal dissipation capacity of future packaging techniques for integrated circuits in view of the expected heat generation characteristics of such future circuit.

SUMMARY OF THE INVENTION

The invention can be briefly described as a package for thermal dissipation of heat from multiple integrated circuit chips. The subject invention includes a silicon substrate containing thin-film multilayer interconnect planes. Multiple integrated circuit chips can be attached to a first surface of a substrate. The invention further includes a means for dissipating heat from a second surface of the silicon substrate.

An object of the invention is to provide a means to dissipate up to six watts per square centimeter of heat generated by integrated circuit chips.

Another object of the invention is to provide a heat-dissipation package for multiple integrated-circuit chips using a single substrate and heat sink.

Another object of the invention is to provide a heat-dissipation package for multiple integrated-circuit chips in which a single heat sink can be adapted to liquid-cooling techniques.

Another object of the invention is to provide a silicon substrate for silicon integrated-circuit chips in which the substrate includes a plurality of cavities, each cavity being designed to accept an individual integrated-circuit chip.

Another object of the invention is to provide a package for enhanced thermal dissipation of heat from integrated-circuit chips having high reliability thus reducing the operating temperature of the chip and reducing the possibility of thermally induced detachment of the chip for its substrate.

Another object of the invention is to provide a highly efficient thermal dissipation package for multiple integrated-circuit chips which is capable of being produced commercially at a low cost. These and other objects and advantages of the invention, as well as the details of an illustrative embodiment, will be more fully understood from the following description and the drawings.

DETAILED DESCRIPTION OF THE PREFERRED EMBODIMENT

Figure 1:
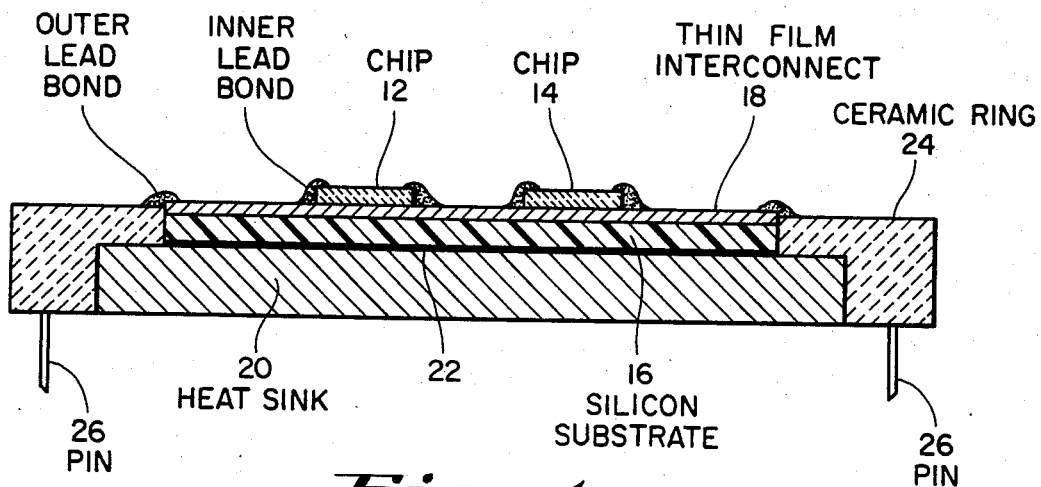
FIG. 1 is a schematic cross-sectional view of a multichip thin-film module.

Referring now to FIG. 1, a plurality of integrated circuits 12,14 are attached to a silicon substrate 16. In the preferred embodiment, the silicon substrate 16 includes multiple layers of thin-film interconnects 18. The silicon substrate and its multilayered thin-film interconnects are more fully described in co-pending application Ser. No. 697,092 filed Jan. 31, 1985 entitled A DEVICE AND METHOD FOR FORMING THIN-FILM ELECTRICAL CONNECTIONS FOR INTEGRATED CIRCUITS. As can be seen in the figure, a heat sink 20 is provided which is contiguous with one surface 22 of the silicon substrate 16. In the final package, a ceramic ring 24 may be provided which contains multiple pins 26 for insertion into a multilayer printed-circuit board (not shown).

Figure 2:
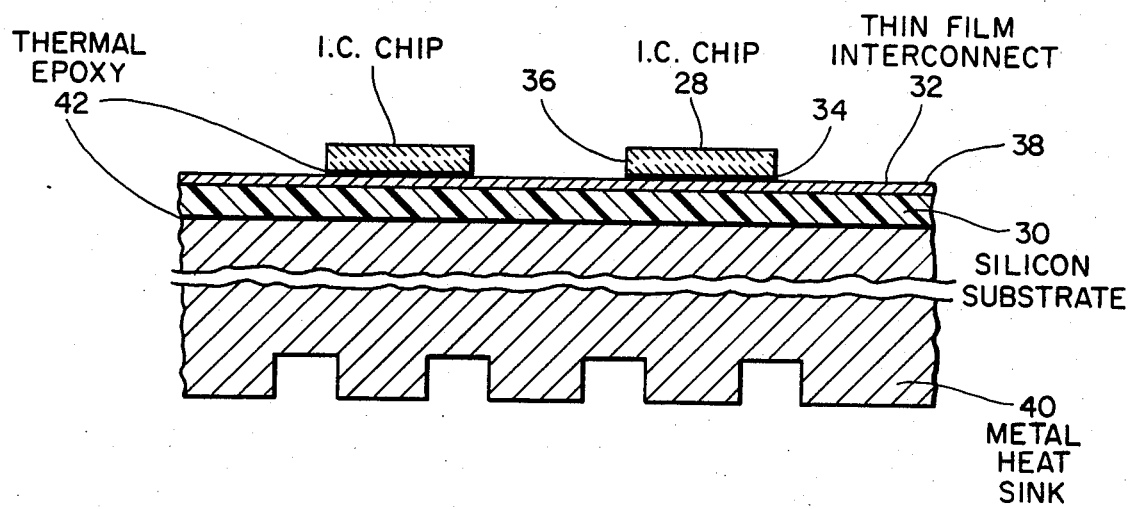
FIG. 2 illustrates one embodiment of the subject invention in which integrated circuit chips are epoxy bonded onto a silicon substrate containing thin-film interconnect planes.

The subject invention comprehends that bipolar integrated circuit chips of future-generation devices may be between 6 millimeter square to 1 centimeter square and have up to 10,000 logic gates per chip. It is envisioned that such devices would have a heat-generation characteristic of approximately 10 to 15 watts per chip. Referring now to FIG. 2, the subject invention comprehends that such future bipolar integrated-circuit chips 28 can be attached to a silicon substrate 30 having thin-film interconnect planes 32. In the preferred embodiment, a thermal epoxy 34 such as Aremco 568, a trademark of Aremco Products, N.Y. is provided between a lower surface 36 of the semiconductor chip and a first surface 38 of the silicon substrate to bond the chip to the substrate without substantially increasing the thermal resistance between junctions in the semiconductor chip and the thermal dissipation package of the subject invention. Although Aremco 568 epoxy is used in the preferred embodiment, other materials may be used such as Abletherm, a trademark of Ablestick Laboratories, Cal., provided that the material used has sufficient adherence characteristics to maintain the semiconductor chip on the substrate and provided that the material used has sufficient resilience to absorb any thermally induced stress. In addition, the material used must have a thermal conductivity on the order of 0.02 watts per centimeter-degree centigrade.

As can be seen in FIG. 2, a second surface of the silicon substrate 30 is provided with a second layer of thermal epoxy 42. A metal heat sink 40 is attached to the second surface of the silicon substrate using thermal epoxy layer 42. In general, any material may be used as the heat sink provided that it has high thermal conductivity, is easy to machine or to manufacture, and is relatively inexpensive. In the preferred embodiments, copper, molybdenum, and aluminum may be used as the heat sink material.

As also can be seen in FIG. 2, the preferred embodiment of the subject invention envisions that the heat sink 40 include fins or other surface-maximizing means to increase the capacity of the heat sink to dissipate heat into the environment. One advantage of the subject invention over heat sinks which are individually attached to each integrated-circuit chip is that a single cooling source may be easily used to provide additional heat dissipation capabilities to the heat sink. For instance, a fan (not shown) may be used to produce forced-air cooling across heat sink 40. In other embodiments, liquid cooling may be provided in a single unit to heat sink 40 to provide additional heat dissipation to the multiple integrated-circuit chips 28.

Figure 3:
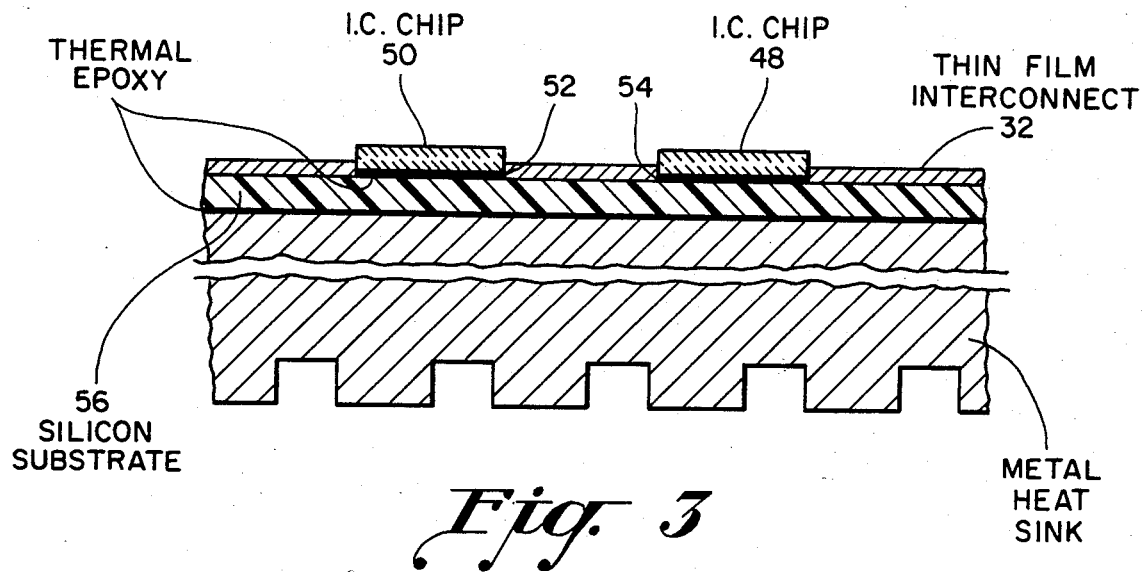
FIG. 3 is a side view of another embodiment of the subject invention in which the integrated-circuit chips are disposed in cavities in an upper surface of the silicon substrate.

Referring now to FIG. 3, another embodiment of the subject invention envisions that integrated circuit chips 48,50 may be located in a series of cavities 52,54 provided in the upper surface of the silicon substrate. As noted in co-pending patent application Ser. No. 697,092, the silicon substrate 56 includes multiple layers of thin-film interconnects 58 sandwiched between a dielectric polymer. The embodiment illustrated in FIG. 3 has several advantages over the embodiment illustrated in FIG. 2. For example, the placement substrate rather than on top of the thin-film interconnect planes 32 increases the heat transfer from the integrated circuit chip to the underlying silicon substrate. Another advantage of placing the integrated circuit chip in cavities is that it virtually eliminates the possibility of any problems arising from a thermal expansion mismatch between the integrated circuit chip and its support. This increases the reliability of the structure since the possibility of detachment of any electrical connections between the chip and its support are reduced.

Figure 4:
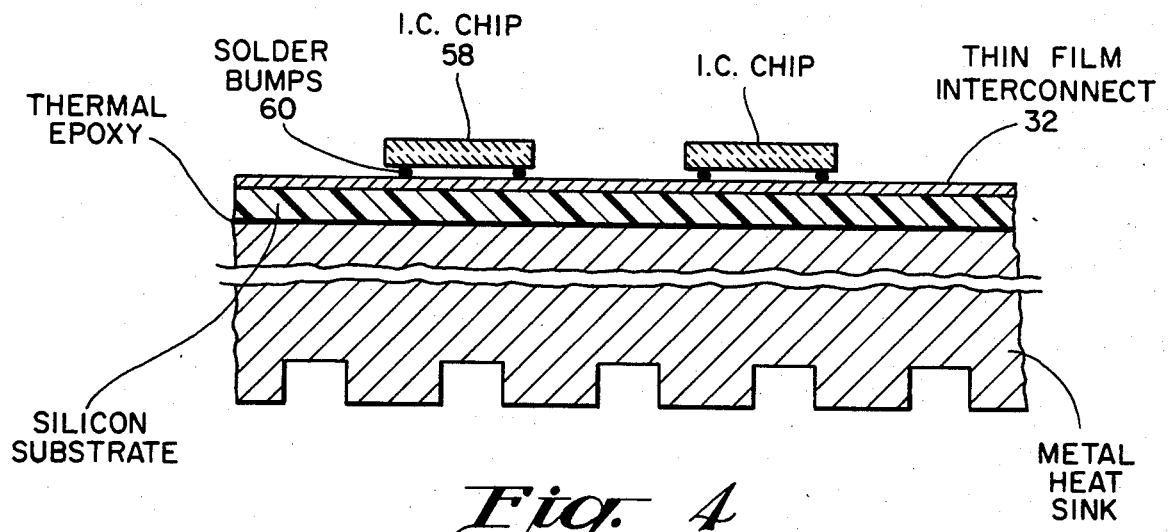
FIG. 4 is a side view of yet another embodiment of the subject invention in which flip chip bonding is employed to attach multiple integrated-circuit chips to a silicon substrate.

Another embodiment of the subject invention is illustrated in FIG. 4. In this embodiment it is envisioned that so called "flip chips" 58 are used. A flip chip is an integrated circuit chip in which numerous input-output pads are provided either around the perimeter or over the entire surface of a chip. The surface of the chip on which the input-output pads are located is then positioned adjacent to the surface of the support material containing the electrical terminals (commonly called solder bumps 60) to which the integrated circuit is to be attached.

From the point of view of maximizing thermal dissipation, the subject invention comprehends that either wire bonding or automated tape bonding is used in the embodiments used in FIGS. 2 and 3 is preferred over solder bump bonding as used in FIG. 4. However, in some embodiments it may be desirable to use solder bump bonding since the number of input-output pads can be maximized using this technique.

Although the invention has been described and illustrated in detail, it is to be clearly understood that the same is by way of illustration and example only, and is not to be taken by way of limitation; the spirit and scope of this invention being limited only by the terms of the appended claims.

We claim:

1. A package having improved heat dissipation comprising:
    a silicon substrate having a first surface and a second surface;
    a plurality of thin film interconnect conductors formed in planes and disposed on said first substrate surface;
    a plurality of silicon chips in thermal communication with said first substrate surface; and
    a heat sink disposed on said second substrate surface and being in thermal contact therewith.

2. The package of claim 1 wherein said silicon chips are disposed on said plurality of interconnect planes.

3. The package of claim 2 further comprising:
    a first layer of thermal adhesive between said silicon chips and said plurality of interconnect planes for bonding said silicon chips to said plurality of interconnect planes; and
    a second layer of thermal adhesive between said second substrate surface and said heat sink for bonding said substrate to said heat sink.

4. The package of claim 1 wherein said heat sink is formed of a material selected from the group consisting of copper, molybdenum, and aluminum.

5. The package of claim 1 wherein said plurality of interconnect planes includes a plurality of cavities and wherein said silicon chips are disposed within said cavities.

6. The package of claim 5 wherein said cavities are of a size to permit said silicon chips to be disposed on said first substrate surface.

7. The package of claim 6 further comprising:
    a first layer of thermal adhesive between said silicon chips and said first substrate surface for bonding said silicon chips to said substrate; and a second layer of thermal adhesive between said second substrate surface and said heat sink for bonding said substrate to said heat sink.

8. The package of claim 3 wherein said thermal adhesive comprises a thermal epoxy.

9. The package of claim 7 wherein said thermal adhesive comprises a thermal epoxy.

10. The package of claim 2 further comprising a plurality of solder bumps disposed between said silicon chips and said plurality of interconnect planes for connecting said silicon chips to said plurality of interconnect planes.

11. The package of claim 10 further comprising a first layer of thermal adhesive between said second substrate surface and said heat sink for bonding said substrate to said heat sink.

12. The package of claim 11 wherein said thermal adhesive comprises a thermal epoxy.

* * * * *